(12) United States Patent
Huang

(10) Patent No.: US 7,063,130 B2
(45) Date of Patent: Jun. 20, 2006

(54) CIRCULAR HEAT SINK ASSEMBLY

(76) Inventor: Chu-Tsai Huang, 5F, No. 12, Alley 5, Lane 106, Minchiuan Rd., Lu Jou, Taipei Hsien (TW)

( * ) Notice: Subject to any disclaimer, the term of this patent is extended or adjusted under 35 U.S.C. 154(b) by 0 days.

(21) Appl. No.: 10/912,111

(22) Filed: Aug. 6, 2004

(65) Prior Publication Data
US 2005/0061478 A1     Mar. 24, 2005

(30) Foreign Application Priority Data
Aug. 8, 2003   (TW) .............................. 92214499 U
May 3, 2004    (TW) .............................. 93206808 U

(51) Int. Cl.
*H05K 7/20* (2006.01)

(52) U.S. Cl. .................. 165/121; 165/80.3; 361/697

(58) Field of Classification Search .................. None
See application file for complete search history.

(56) References Cited

U.S. PATENT DOCUMENTS

| | | | |
|---|---|---|---|
| 4,715,438 A * | 12/1987 | Gabuzda et al. ............ 165/185 |
| 5,132,780 A * | 7/1992 | Higgins, III ................ 257/722 |
| 5,597,034 A * | 1/1997 | Barker et al. .............. 165/80.3 |
| 6,196,300 B1 * | 3/2001 | Checchetti ................ 165/80.3 |
| 6,386,275 B1 * | 5/2002 | Kuo et al. .................. 165/80.3 |
| 6,543,522 B1 * | 4/2003 | Hegde ....................... 165/80.3 |
| 6,552,902 B1 * | 4/2003 | Cho et al. .................. 361/704 |
| 6,671,172 B1 * | 12/2003 | Carter et al. ............... 361/697 |
| 6,779,593 B1 * | 8/2004 | Hegde ....................... 165/80.3 |
| 6,886,627 B1 * | 5/2005 | Kozyra et al. ............. 165/80.3 |
| 2001/0050164 A1 * | 12/2001 | Wagner et al. ......... 165/104.33 |
| 2002/0046826 A1 * | 4/2002 | Kao ...................... 165/104.33 |
| 2003/0131970 A1 * | 7/2003 | Carter et al. ............... 165/80.3 |
| 2004/0011508 A1 * | 1/2004 | Tan et al. .................. 165/80.3 |

\* cited by examiner

*Primary Examiner*—Allen J. Flanigan
(74) *Attorney, Agent, or Firm*—Troxell Law Office, PLLC

(57) ABSTRACT

The present invention discloses a circular heat sink to improve a traditional extruded aluminum heat sink or a traditional compressed aluminum heat sink by adopting a plurality of streamlined curved heat dissipating fins and a conical base to constitute the circular heat sink. The shape of the heat dissipating fin is designed to have a streamlined curved surface; and the circular heat sink assembly comprises a plurality of fan-shaped heat dissipating fins stacked and encircled into a circular shape and the curvature of the bottom of the heat dissipating fin can be designed according to the conical shape of the conical base, and a latch structure for the heat dissipating fin is adopted. If the plurality of the heat dissipating fins with a streamlined curved surface is stacked into a circular shape, then a plurality of folded flanges along the sides of the plurality of heat dissipating fins are latched and encircled to form a circular ring, and the fan-shaped folded flanges at the bottom of the heat dissipating fins also are stacked and encircled to form a circular ring and then connected to a conical base to form a circular heat sink having a plurality of streamlined heat dissipating fins with a curved surface.

6 Claims, 13 Drawing Sheets

CIRCULAR HEAT SINK ASSEMBLY

BACKGROUND OF THE INVENTION

1. Field of the Invention

The present invention relates to a circular heat sink assembly, more particularly to a heat sink assembly capable of saving its assembling time and maximizing its heat dissipation effect.

2. Description of the Related Art

As the computer industry is blooming, the product design for computers tends to be light, thin, short, and compact and the quantity of heat produced by electronic components such as a microprocessor and a chip is getting larger and larger, so that heat dissipation becomes an important subject for maintaining a normal operation of computer systems. As to the methods for dissipating heat from a computer system, a plurality of heat dissipating fins is generally used to be attached onto the surface of a heat generating electronic component and works together with a fan to dissipate the heat out of the computer system and prevents an electronic component from being overheated or burned as well as extending its life. In general, heat sinks are divided into two types: a parallel heat sink as shown in FIG. 1 and a circular heat sink as shown in FIGS. 2 and 3; and the three methods for manufacturing heat sinks include aluminum extrusion, aluminum compression, and stacking.

However, all of the foregoing three manufacturing methods can be adopted for manufacturing the parallel heat sinks, but a very thin thickness cannot be achieved during the manufacture of an extruded aluminum or a compressed aluminum heat sink due to the limitations of the mechanical manufacturing capability, and thus the density (total heat dissipating area per unit volume) of a heat sink that combines several heat dissipating fins together is low. It is obvious that a stacked heat sink can be made very thin and has a higher density. In other words, the total heat dissipating area per unit volume of a stacked heat sink is larger, and thus has a better heat dissipating capacity.

Further, at present, the circular heat sinks only adopt an aluminum extrusion method or an aluminum compression method for manufacturing the heat dissipating fins and seldom use the stacking method for the manufacture at all.

From the description above, it is known that the heat dissipation performance of the foregoing heat sink assembly can be improved. In view of the feasibility of improving the aforementioned heat dissipating performance, the inventor of the present invention provides a design capable of enhancing the heat dissipating performance.

SUMMARY OF THE INVENTION

The primary objective of the present invention is to improve the fan-shaped heat dissipating fins being stacked with each other into a circular heat sink assembly as disclosed in the R.O.C. Utility Model Patent No. 196973 (the term of the patent right is from Oct. 21, 2001 to Jul. 15, 2013 and the inventor of this utility model patent is the same inventor of the present invention). The present invention provides a circular heat sink assembly with a conical base that comprises a plurality of heat dissipating fins with an aslant and curved bottom, and these heat dissipating fins are stacked together into a conical shape and coupled to a conical base to form a heat sink. The heat sinks of this sort have simple structure, an easy way for its manufacture and a better heat dissipating performance than the prior-art heat sinks.

The inventor of the present invention has disclosed a circular heat sink assembly being comprised of a plurality of fan-shaped heat dissipating fins stacked together as disclosed in the R.O.C. Utility Model Patent No. 196973, and the circular heat sink assembly includes three sections: (1) a fan-shaped heat dissipating fin; (2) a circular latch; and (3) a conical base.

The circular heat sink assembly according to the R.O.C. Utility Model Patent No. 196973 mainly focuses on the characteristics of the fan-shaped heat dissipating fin:

(1) The heat dissipating fin is designed into a fan shape and can be stacked and encircled into a circular shape.

(2) The heat dissipating fin is designed into a folded flange, such that when a plurality of heat dissipating fins is coupled, there will be no overlap phenomenon and thus can maintain the precision of the dimensions.

(3) The heat dissipating fins come with a groove along the folded flange and are latched with the circular latch as to mount the heat dissipating fins into place easily.

In the circular heat sink with a conical base as disclosed in the R.O.C. Utility Model Patent No. 092214499 issued to the inventor of the present invention, the circular heat sink according to such invention comprise three sections: (1) a heat dissipating fin with a curved bottom; (2) a circular latch; and (3) a conical base.

The R.O.C. Utility Model Patent No. 092214499 focuses on the design of a conical base and a fan-shaped heat dissipating fin with a curvature is characterized in that:

(1) The bottom of the heat dissipating fin (and the surface for connecting the conical base) is designed into a curved shape and has a curvature adjustable according to the conical shape of the conical base.

(2) The fan-shaped heat dissipating fin has a bottom with a curvature that can be stacked into a circular shape, and a plurality of fan-shaped heat dissipating fins with a curved bottom can be connected into a conical shape and then connected to a conical base to form a heat sink.

Therefore, it is the primary objective of the present invention is to provide an improved circular heat sink assembly comprised of the three sections: (1) a heat dissipating fin having a streamlined curved surface; (2) a circular latch; and (3) a conical base.

The circular heat sink having a streamlined curved surface in accordance with this patent focuses on the following structural and design characteristics:

(1) The heat dissipating fin is designed into one having a streamlined curved surface, so that a fluid can flow more smoothly, and it has a larger flow and a better heat dissipating performance.

(2) The heat dissipating fin is designed into one having a folded flange at the external side for its latch, and there are two main functions:

(a) Easy to Install: A plurality of heat dissipating fins is latched with each other into a series through the folded flange, and then stacked and encircled into a circular shape, and thus it is not necessary to install the heat dissipating fins one by one.

(b) Prevent the fluid to flow out from the external side of the circular ring of the heat sink: If an axle fan is installed on the heat sink, the fluid is blown downward towards the heat sink, the folded flange at the external side can prevent the fluid from flowing out from the external side section of the circular ring of the heat sink. In other words, we try to let the fluid be flown downwards through the heat dissipating fins to carry away the heat, and avoid the fluid from flowing out from the external side section of the circular ring of the heat dissipating fin without passing through the heat dissipating fins.

(3) The fan-shaped folded flange at the bottom of the heat dissipating fin is designed into a conical shape with a curvature, and there are two main functions:

(a) The fan-shaped folded flange can maintain the precision of the dimensions: This heat dissipating fins with a fan-shaped folded flange can be stacked into a circular shape, and the bottom of these heat dissipating fins are attached with each other tightly to form a circular shape, and thus there will be no overlap phenomenon and the dimensions can be maintained precisely.

(b) The curvature of the conical shape gives a smooth flow of the fluid: The bottom of the heat dissipating fin (which is the connecting surface with the conical base) is designed into a shape with a curvature, and the curvature of the bottom of the heat dissipating fin can be adjusted according to the curvature of the conical shape of the base, and the heat dissipating fins are connected with the conical base to form the circular heat sink. If an axle fan is installed on the heat sink, the fluid will flow downwards towards the heat sink, and the fluid will flow smoothly through the conical base without hitting the base and to rebound and lose energy.

(4) The circular latch has two main functions:

(a) Fix the heat dissipating fins into place: A plurality of heat dissipating fins is stacked, encircled, and latched into a circular shape, and a groove is designed to be disposed at the folded flange on the internal side section of the heat dissipating fin, and the groove also is encircled into a circular shape. The circular latch is placed into the groove for latching the heat dissipating fins into a fixed position and preventing the heat dissipating fins from shifting towards the center of the heat sink.

(b) Fix the fan: A hook is designed to be disposed at the plastic base of the hub of a fan. When the fan and the heat sink are combined, the hook of the fan hooks into the center of the heat sink, and the hook can hook to the circular latch in order to fix the fan.

(5) Conical base: The heat dissipating fin having a streamlined curved surface is coupled with the conical base to form a circular heat sink. When the axle fan is installed on the heat sink, the fluid is blown downwards onto the heat sink and the fluid can flow smoothly through the conical base without heating the base to rebound and lose energy, and thus such arrangement can enhances the heat dissipating performance.

The above objects, features and advantages of the present invention will become apparent from the following detailed description taken with the accompanying drawing. However, these drawings are provided for reference and illustration and not intended to act as a limitation to the present invention.

DETAILED DESCRIPTION OF THE PREFERRED EMBODIMENTS

Figure 1:
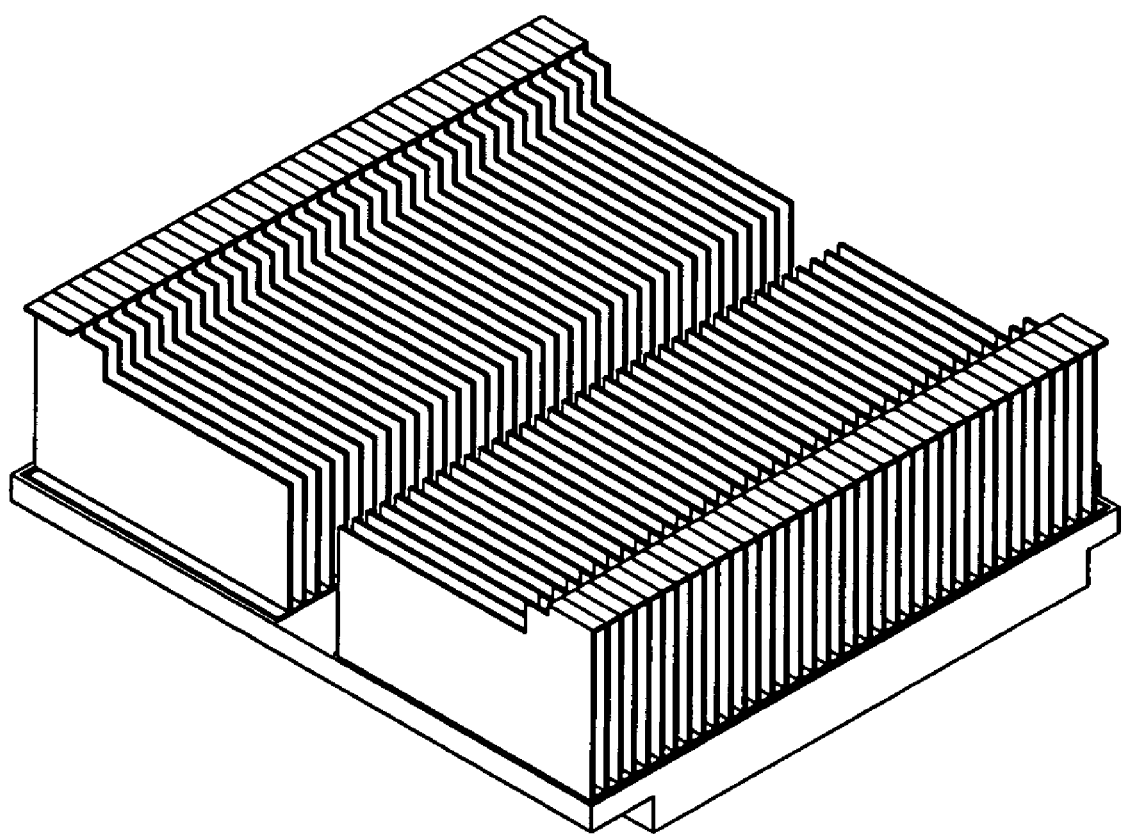
FIG. 1 is a perspective view of a prior-art parallel heat sink.
Figure 2:
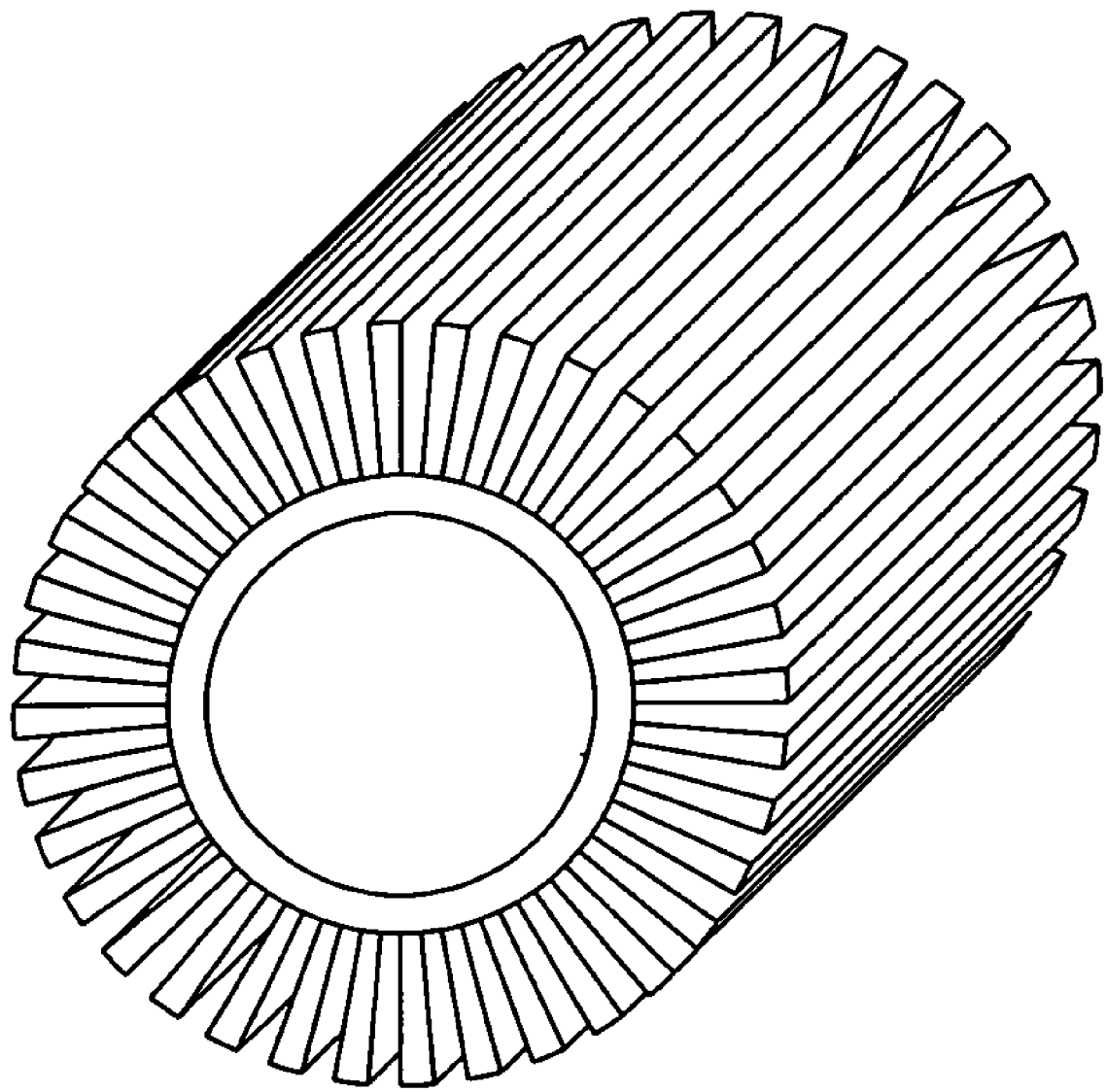
FIG. 2 is a perspective view of a prior-art circular heat sink.
Figure 3:
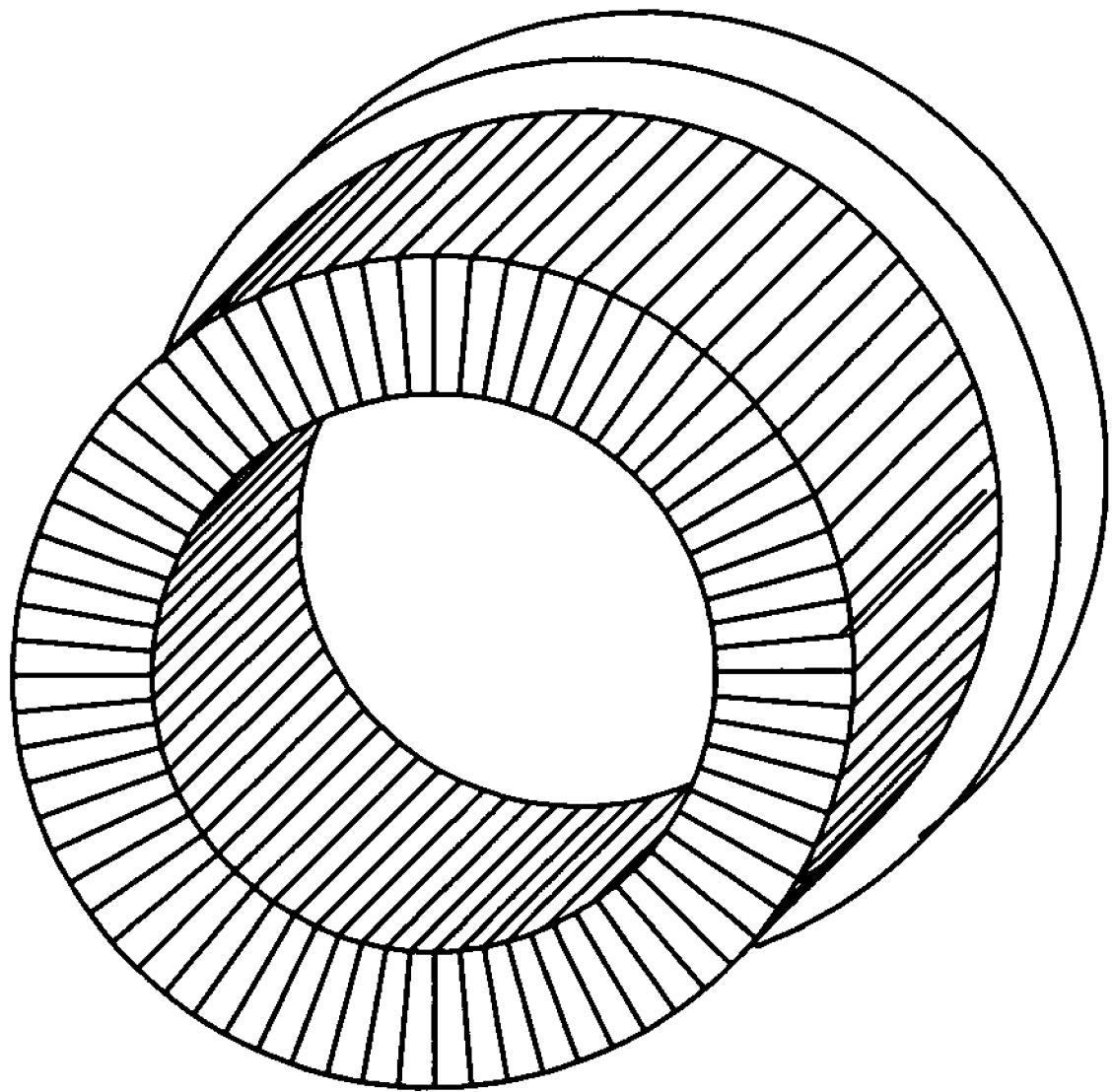
FIG. 3 is a perspective view of a prior-art circular heat sink having planar heat dissipating fins.
Figure 4B:
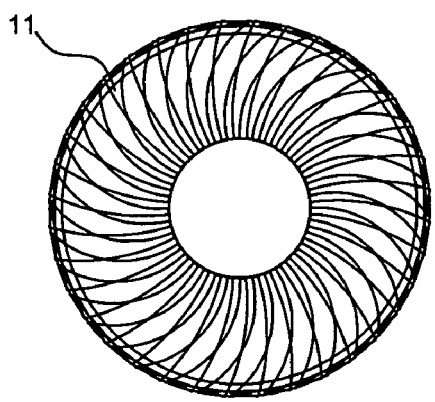
FIG. 4B is a top view of FIG. 4A.
Figure 4A:
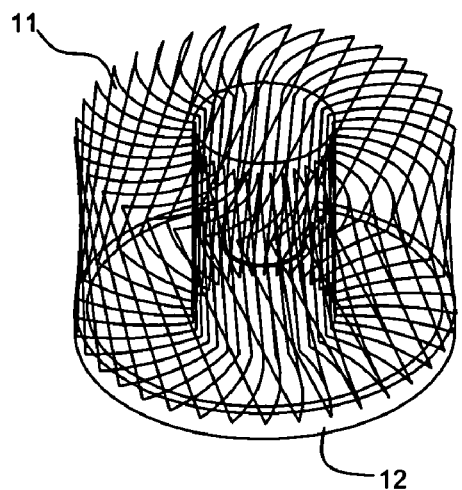
FIG. 4A is a perspective view of a circular heat sink having curved heat dissipating fins according to the present invention.
Figure 4C:
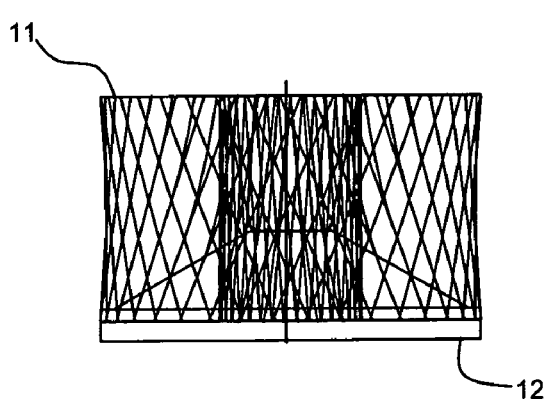
FIG. 4C is a front view of FIG. 4A.
Figure 5B:
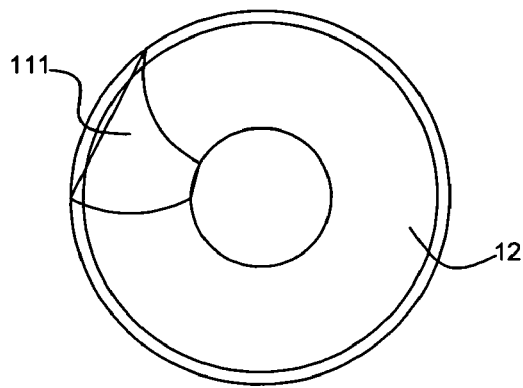
FIG. 5B is a top view of FIG. 5A.
Figure 5A:
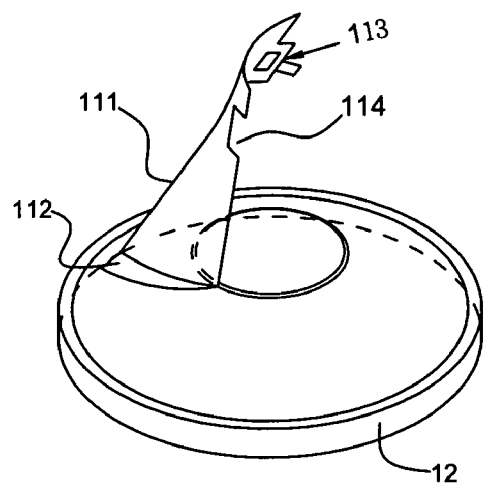
FIG. 5A is a perspective view of the single heat dissipating fin with a streamlined curved surface according to the present invention.
Figure 5C:
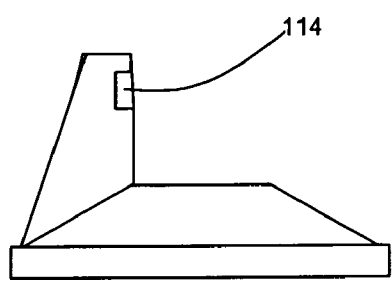
FIG. 5C is a side view of FIG. 5A.
Figure 6B:
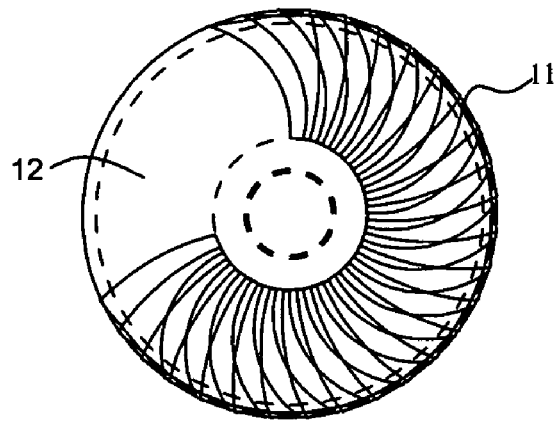
FIG. 6B is a top view of FIG. 6A.
Figure 6A:
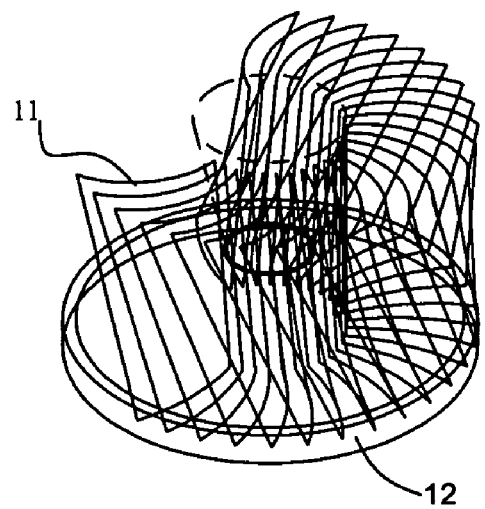
FIG. 6A is a perspective view of the single heat dissipating fin with a partial streamlined curved surface according to the present invention.
Figure 6C:
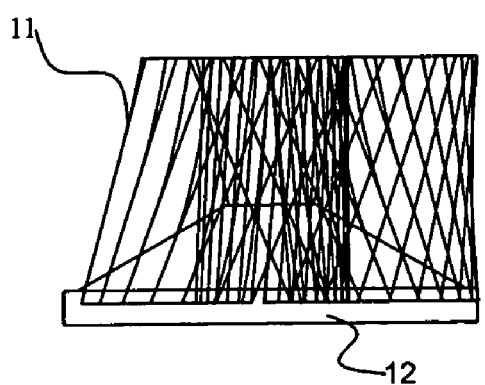
FIG. 6C is a side view of FIG. 6A.

Please refer to FIGS. 4 to 8 for the first preferred embodiment of the present invention. The present invention provides a circular heat sink assembly having a heat dissipating fin with a streamlined curved surface. The circular heat sink assembly comprises a circular heat sink 1 having a plurality of heat dissipating fins 11 with a single streamlined curved surface and being connected to a conical heat dissipating base 12 to form the circular heat sink. Each single heat dissipating fin 11 comprises a main body 111 as shown in FIG. 5, and a side of the main body 111 being coupled to a folded flange 111 on a side and a fan-shaped folded flange 112 at the bottom. Both ends of the fan shape use the same concentric point and different radii to form two arc sections of different lengths and a groove 114 is disposed at the central position of the main body 111 as shown in FIG. 5.

Figure 7:
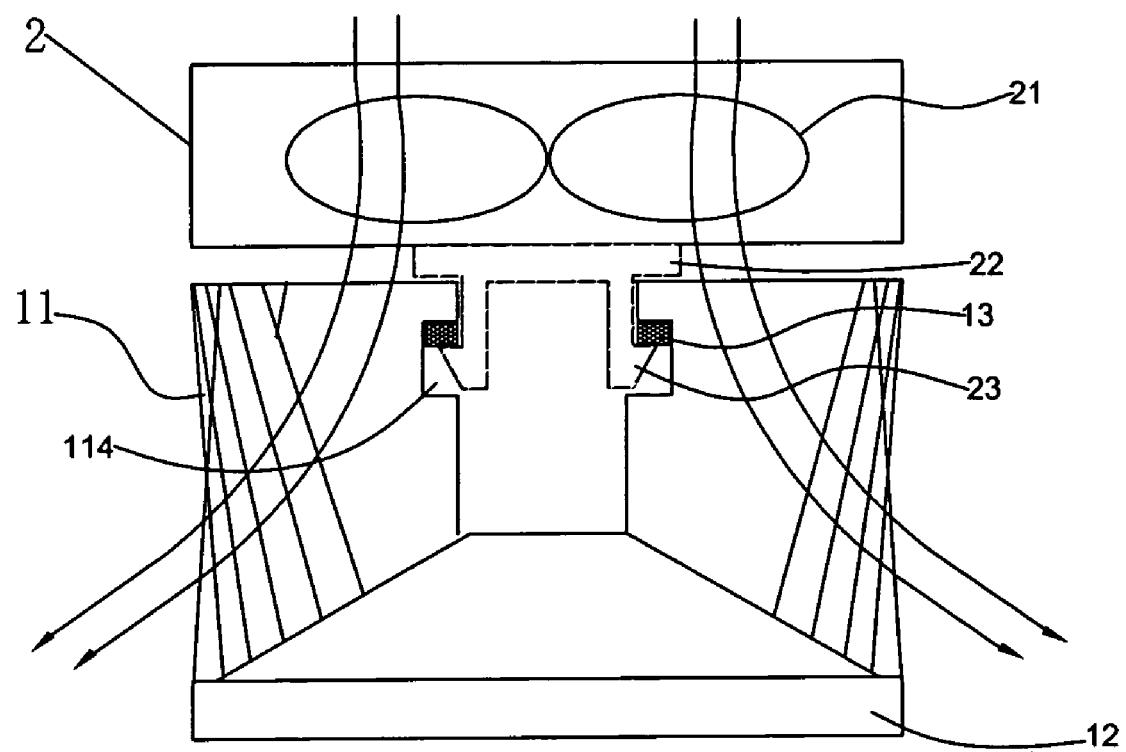
FIG. 7 is an illustrative view of the circular heat sink being coupled with a fan according to the present invention.
Figure 8:
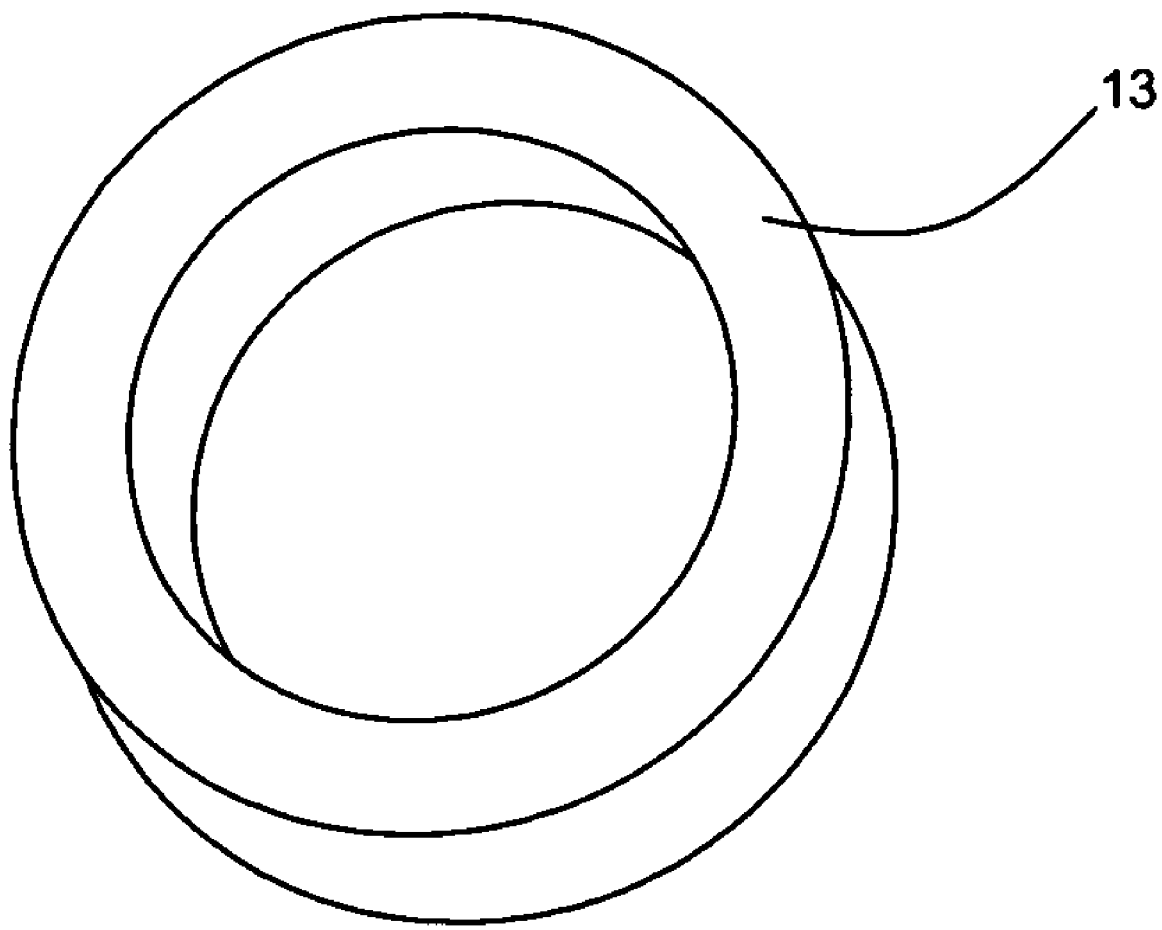
FIG. 8 is a perspective view of the circular latch according to the present invention.

The plurality of single heat dissipating fins 11 uses a pressing section to tightly align the single heat dissipating fins 11 into a close circular ring shape, and then all grooves 114 of the single heat dissipating fin 11 are encircled into a close circular ring shape as shown in FIG. 7, and a circular latch 13 (as shown in FIGS. 7 and 8) having the same size of the close circular ring is placed into the groove 114, so that the plurality of the single heat dissipating fins 11 is latched into a fixed position to prevent the heat dissipating fins from shifting towards the center of the heat sink. A plurality of heat dissipating fins is latched with each other into a series from the folded flange 113 at the external side and stacked and encircled into a circular shape, and then the whole set of heat dissipating fins is connected onto a conical base as shown in FIG. 5 to form a circular heat sink 1 as shown in FIG. 4. When an axle fan 14 is installed onto the heat sink, the fluid is blown downward towards the heat sink 1, and the folded flange 113 at the external side section can prevent the fluid from flowing out from the circular ring of the heat sink. A plastic hook 23 is designed to be disposed at the center of a plastic base 21 of a fan 2, such that when the fan 2 is coupled with the heat sink 1, the fan hook 23 passes through the center of the heat sink 1 and the hook 23 hooks the circular latch 13 to fix the fan 2 into place.

Figure 9B:
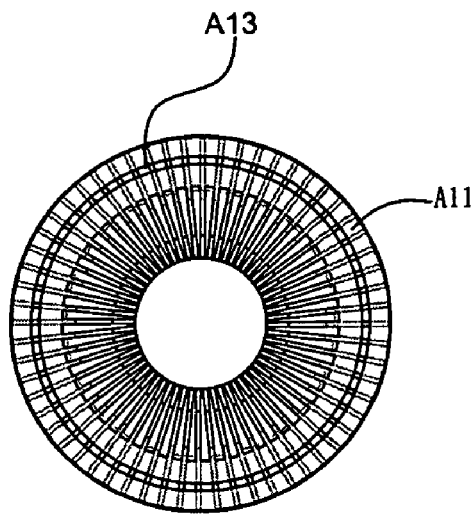
FIG. 9B is a top view of FIG. 9A.
Figure 9A:
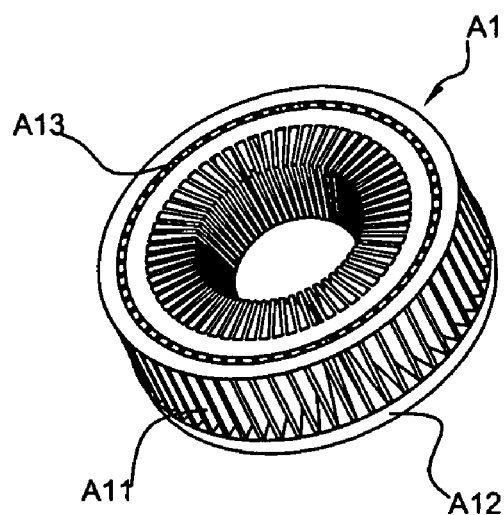
FIG. 9A is a perspective view of a circular heat sink with a conical base according to the present invention.
Figure 9C:
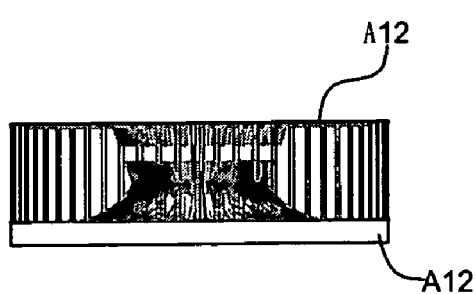
FIG. 9C is a side view of FIG. 9A.
Figure 10:
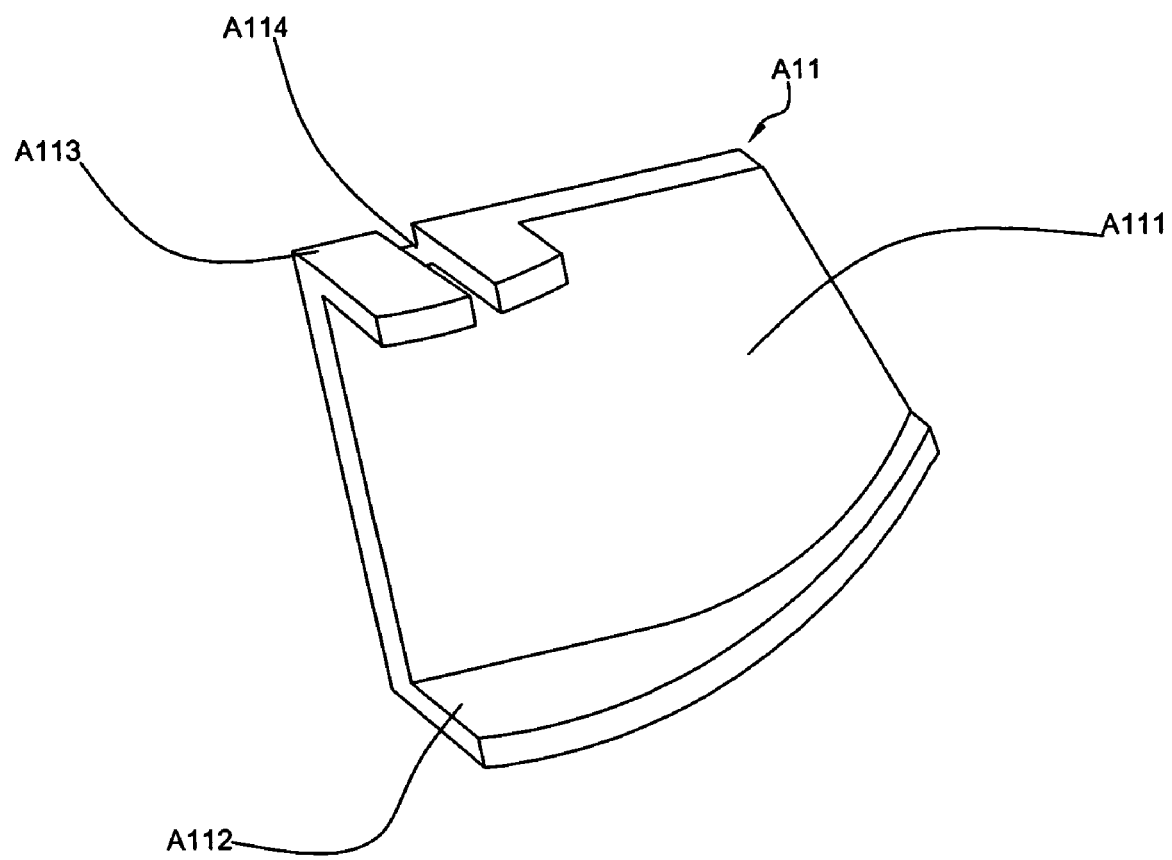
FIG. 10 is a perspective view of a single fan-shaped heat dissipating fin having a curvature according to the present invention.

Please refer to FIGS. 9 to 13 for the first preferred embodiment of the present invention. The present invention provides a circular heat sink assembly having a heat dissipating fin with a streamlined curved surface. The circular heat sink assembly comprises a circular heat sink A1 having a plurality of fan-shaped heat dissipating fins 11 with a curved folded flange at the bottom. The circular heat sink A1 comprises a plurality of single heat dissipating fins A11 being connected to a conical heat dissipating base A12 to form the circular heat sink A1. Each single heat dissipating fin A11 comprises a main body A111 as shown in FIG. 10, and an upper folded flange A112 and a lower folded flange A113 are connected to the upper and lower sides of the main body A111 respectively. Both folded flanges A112 and A113 are perpendicular to the main body A111, and the folded flanges A112, A113 are designed into a fan shape. Both ends of the fan shape use the same concentric point and different radii to form two arc sections of different lengths and a groove A114 is disposed at the central position of the main body 111.

Figure 11A:
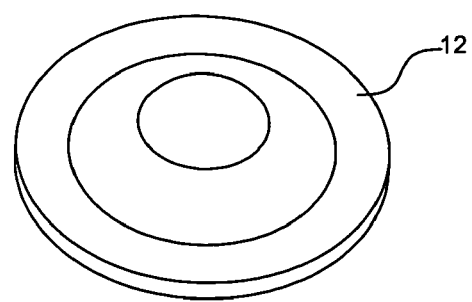
FIG. 11A is a perspective view of the conical base according to the present invention.
Figure 11B:
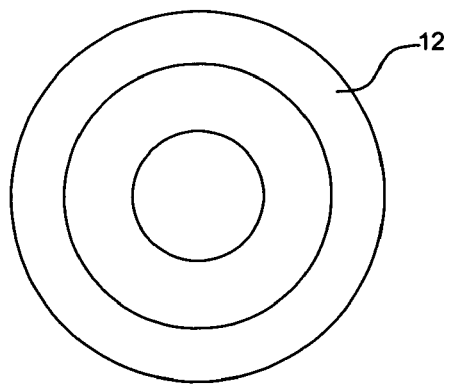
FIG. 11B is a top view of FIG. 11A.
Figure 11C:
FIG. 11C is a side view of FIG. 11A.
Figure 12:
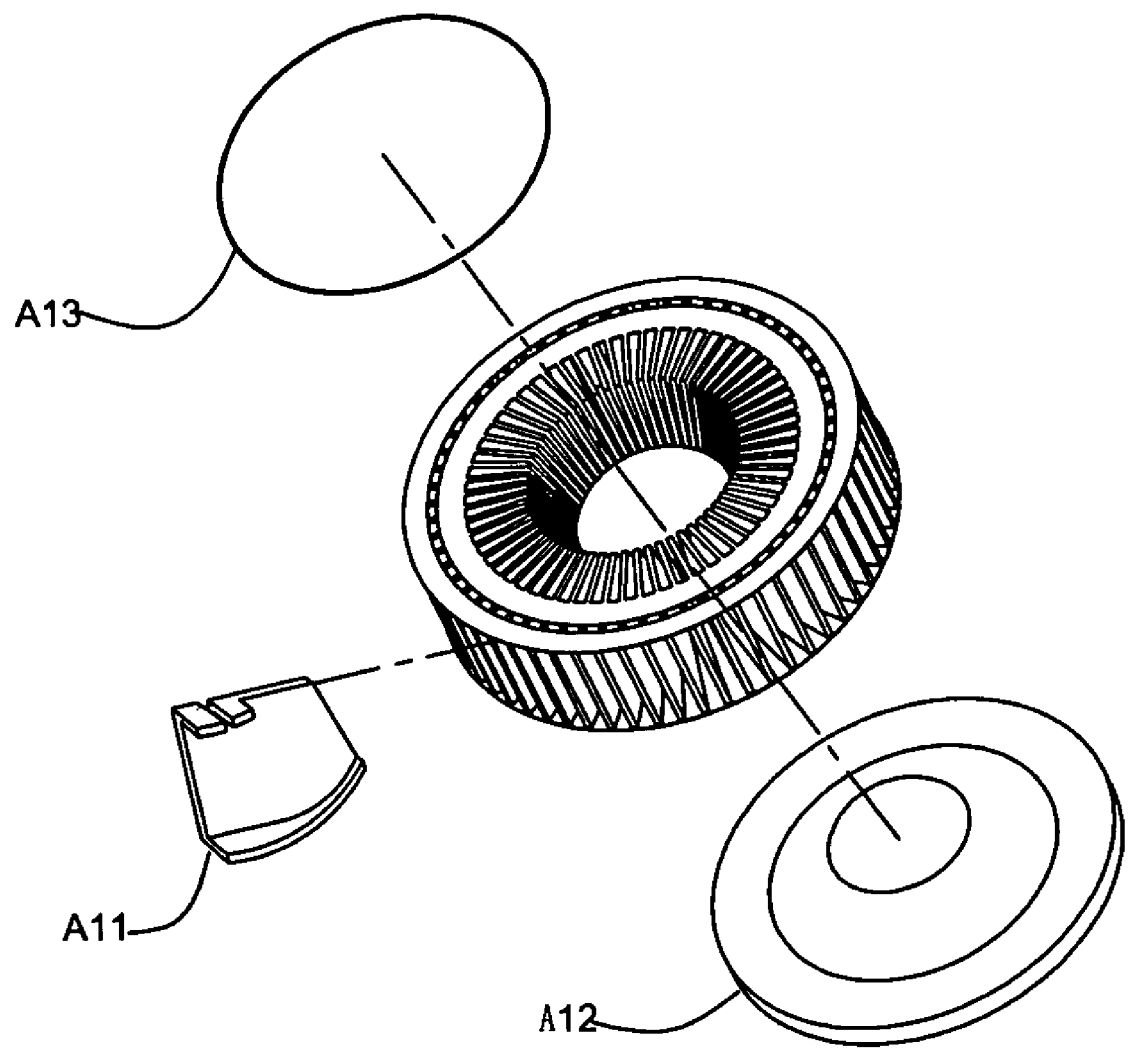
FIG. 12 is a perspective assembly view of the circular heat sink with a conical base according to the present invention.
Figure 13A:
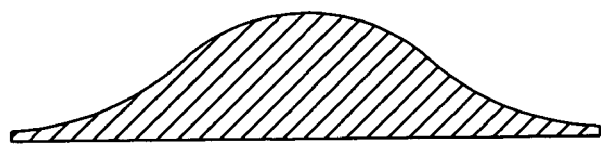
FIG. 13A is a bell-shaped perspective view of conical base according to the present invention.
Figure 13B:
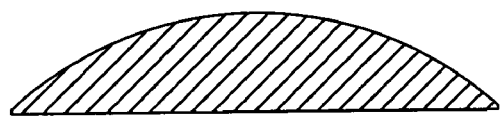
FIG. 13B is a circular perspective view of conical base according to the present invention.
Figure 13C:
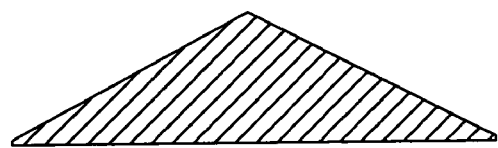
FIG. 13C is a triangular perspective view of conical base according to the present invention.
Figure 13D:
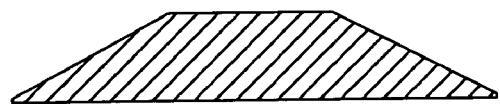
FIG. 13D is a trapezoid perspective view of conical base according to the present invention.
Figure 13E:
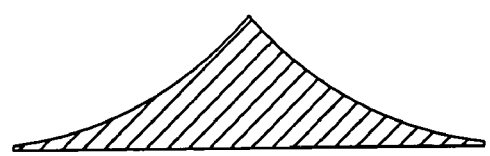
FIG. 13E is an angular perspective view of conical base according to the present invention.

The plurality of single heat dissipating fins A11 uses a pressing section to tightly align the single heat dissipating fins A11 into a close circular ring shape as shown in FIG. 12, and a circular latch A13 having the same size of the close circular ring is placed into the groove A114, so that the plurality of the single heat dissipating fins A11 is latched into a fixed position, and the whole set of heat dissipating fins is connected to the conical heat dissipating base A12 as shown in FIG. 11 to form a circular heat sink A1 as shown in FIG. 9.

While the invention has been described by way of examples and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance than the conventional structure and further complies with the patent application requirements and is submitted to the Patent and Trademark Office for review and granting of the commensurate patent rights.

What is claimed is:

1. A circular heat sink assembly comprising:
a plurality of streamlined-surface fins, each of the plurality of streamlined-surface fins is made of a metal material by a mechanical manufacturing method including a press formation, and includes a main body with a streamlined surface; and
a conical base made of a metal material by a mechanical manufacturing method, and comprising a main body substantially in a conical shape and the streamlined-surface of each of the plurality of streamlined-surface fins being positioned in a circular shape and having a conical connecting surface, and the conical connecting surface having a curvature selected from a group consisting of a bell-shaped cone, a circular cone, and an angular cone with various angles;
wherein the plurality of the streamlined-surface fins are positioned and latched to form a circular shape, and each of the plurality of streamlined-surface fins has a groove located on a folded flange at an internal side thereof, and each groove of the plurality of streamlined-surface fins is positioned to form a circular shape, a circular latch is placed and latched into each groove, and then coupled with the conical base to form the heat sink, and a fan hook is disposed on a plastic base at a center of a fan, the fan hook passes through a center of the heat sink to hook the circular latch fixing the fan and the heat sink.

2. The circular heat sink assembly according to claim 1, wherein the main body of each of the plurality of streamlined-surface fins has a shape selected from a group consisting of a plane and a curved surface, the main body is coupled to a sector-shaped flange, wherein, the curvature of the conical connecting surface between the folded flange on the main body and the conical base conforms to the conical shape of the conical base so as to adjust the curvature of the folded flange on the main body.

3. The circular heat sink assembly according to claim 1, wherein each of the plurality of streamlined-surface fins comprises a sector-shaped folded flange coupled to a bottom of the main body, and the plurality of streamlined-surface fins are stacked into a circular shape with each sector-shaped folded flange engaging an adjacent one of the plurality of streamlined-surface fins with out overlapping.

4. The circular heat sink assembly according to claim 1, wherein each of the plurality of streamlined-surface fins includes a folded flange latched to a folded flange on an external side section, such that the plurality of streamlined-surface fins are latched in series in a circular shape preventing a fluid from flowing out from a circular ring of the heat sink as to reduce the loss of flow.

5. The circular heat sink assembly according to claim 1, wherein each of the plurality of streamlined-surface fins comprises a folded flange individually disposed at the upper and lower section of the main body and the plurality of streamlined-surface fins are coupled into a series and stacked and encircled into a circular shape.

6. The circular heat sink assembly according to claim 1, wherein the fan hook passes through the outside of the heat sink to fix the fan and the heat sink.

* * * * *